United States Patent
Woo

(10) Patent No.: US 10,243,258 B2
(45) Date of Patent: Mar. 26, 2019

(54) MOBILE TERMINAL

(71) Applicant: LG ELECTRONICS INC., Seoul (KR)

(72) Inventor: Seungmin Woo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/461,412

(22) Filed: Mar. 16, 2017

(65) Prior Publication Data

US 2018/0069298 A1 Mar. 8, 2018

(30) Foreign Application Priority Data

Sep. 7, 2016 (KR) .......................... 10-2016-0115094

(51) Int. Cl.
*H01Q 1/24* (2006.01)
*H01Q 5/335* (2015.01)
(Continued)

(52) U.S. Cl.
CPC .............. *H01Q 1/243* (2013.01); *H01Q 5/335* (2015.01); *H01Q 5/35* (2015.01); *H03H 1/00* (2013.01); *H03H 7/38* (2013.01); *H01Q 1/52* (2013.01)

(58) Field of Classification Search
CPC ............ H01Q 1/243; H01Q 1/38; H01Q 1/52; H01Q 5/335; H01Q 1/24
(Continued)

(56) References Cited

U.S. PATENT DOCUMENTS

| 2003/0176176 A1* | 9/2003 | Leinonen | H04B 7/12 455/277.1 |
| 2012/0218723 A1* | 8/2012 | Kwak | H01Q 1/243 361/748 |

(Continued)

FOREIGN PATENT DOCUMENTS

| CN | 104901015 | 9/2015 |
| KR | 1020140114691 | 9/2014 |

OTHER PUBLICATIONS

PCT International Application No. PCT/KR2017/002453, Notification of Transmittal of the International Search Report and the Written Opinion of the International Searching Authority, or Declaration dated Jun. 16, 2017, 11 pages.

*Primary Examiner* — Hai V Tran
(74) *Attorney, Agent, or Firm* — Lee Hong Degerman Kang & Waimey

(57) ABSTRACT

A mobile terminal comprises a case; a main board packaged in the case; a signal supply unit packaged on the main board, supplying a radio signal; an antenna radiator packaged in the case, including a conductive material and transmitting and receiving a signal of a first frequency; an antenna tuner packaged in the case, including a conductive material; a feeding line located on the main board, having one end connected with the signal supply unit and the other end connected with the antenna radiator; and a tuning line located on the main board, having one end connected to the feeding line and the other end connected with the antenna tuner, wherein the tuning line and the antenna tuner compensate for impedance of the feeding line and the antenna radiator. The mobile terminal can prevent wireless communication performance from being deteriorated by impedance distorted by an external environment like that a body of a user approaches the antenna radiator.

14 Claims, 14 Drawing Sheets

(51) Int. Cl.
*H03H 1/00* (2006.01)
*H03H 7/38* (2006.01)
*H01Q 5/35* (2015.01)
*H01Q 1/52* (2006.01)

(58) Field of Classification Search
USPC .......................................... 361/748; 343/702
See application file for complete search history.

(56) References Cited

U.S. PATENT DOCUMENTS

| | | |
|---|---|---|
| 2013/0222205 A1 | 8/2013 | Manssen et al. |
| 2014/0062815 A1 | 3/2014 | Tsai et al. |
| 2015/0116158 A1 | 4/2015 | Alrabadi et al. |
| 2016/0285503 A1* | 9/2016 | Poulin .................... H03F 3/195 |

* cited by examiner

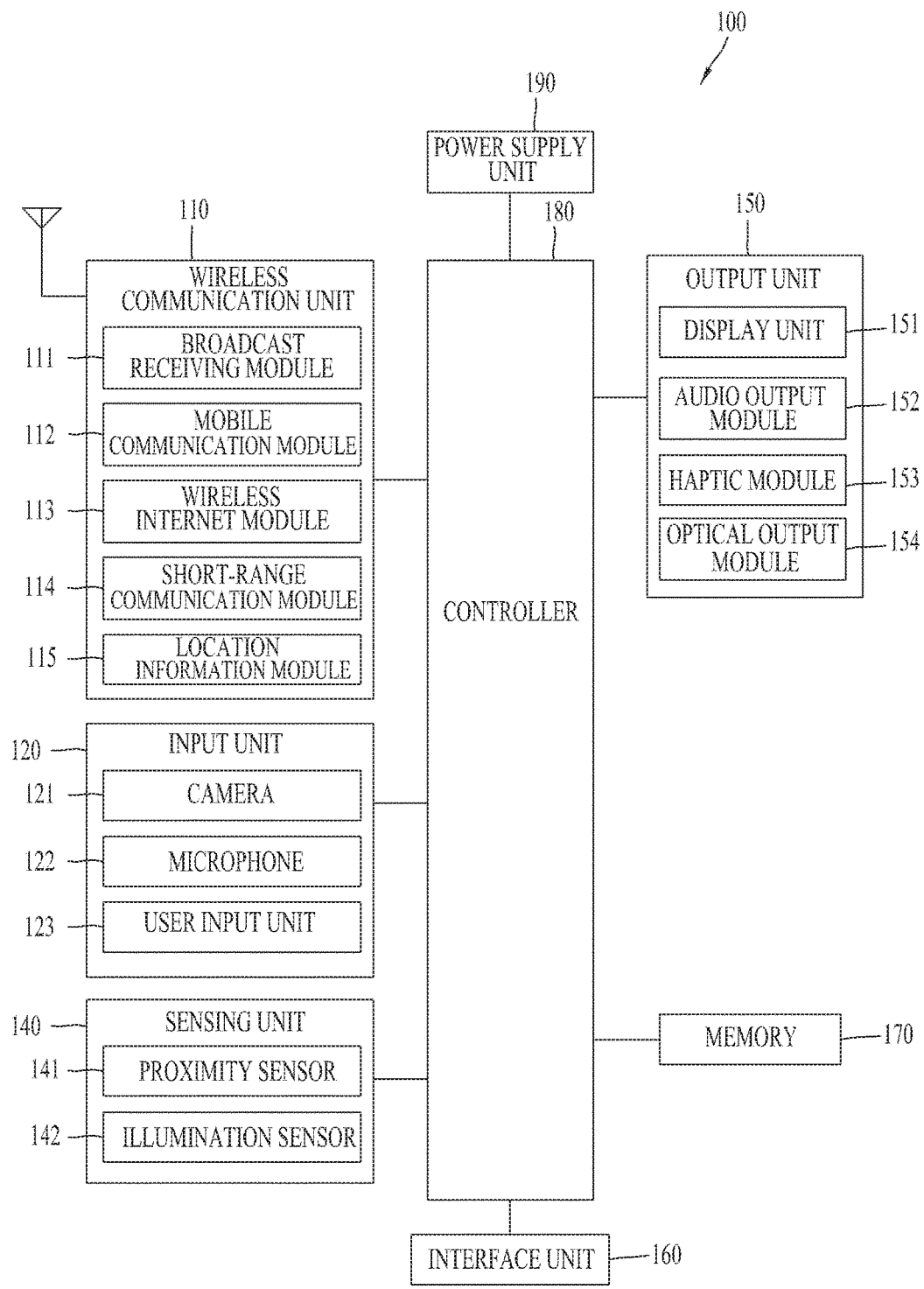

I. normal

II. Hand effect

III. Imaginary Impedance Part Cancellation (a)

(b)

(a)

(b)

(a)

(b)

(a)

(b)

(a)

(b)

(a)

(b)

(a)

(b)

MOBILE TERMINAL

CROSS-REFERENCE TO RELATED APPLICATIONS

Pursuant to 35 U.S.C. § 119(a), this application claims the benefit of earlier filing date and right of priority to Korean Patent Application No. 10-2016-0115094, filed on Sep. 7, 2016, the contents of which are all hereby incorporated by reference herein in their entirety.

BACKGROUND OF THE INVENTION

Field of the Invention

The present invention relates to a mobile terminal that improves antenna performance.

Discussion of the Related Art

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

As such functions become more diversified, the mobile terminal can support more complicated functions such as capturing images or video, reproducing music or video files, playing games, receiving broadcast signals, and the like. By comprehensively and collectively implementing such functions, the mobile terminal may be embodied in the form of a multimedia player or device.

The mobile terminal may include a plurality of antenna radiators to transmit and receive radio signals of various frequency bands in accordance with enlargement of multimedia functions. The antenna radiator is a conductive material for transmitting and receiving a signal of a specific frequency under the control of a wireless communication module, and may have one side connected with the wireless communication module and may be attached to a surface of a case to minimize an effect from the other parts inside the mobile terminal or the case may be used as the antenna radiator.

SUMMARY OF THE INVENTION

Accordingly, the present invention is directed to a mobile terminal that substantially obviates one or more problems due to limitations and disadvantages of the related art.

An object of the present invention is to provide a mobile terminal having a structure that wireless communication performance is prevented from being deteriorated due to impedance distorted by an external environment.

Additional advantages, objects, and features of the specification will be set forth in part in the description which follows and in part will become apparent to those having ordinary skill in the art upon examination of the following or may be learned from practice of the specification. The objectives and other advantages of the specification may be realized and attained by the structure particularly pointed out in the written description and claims hereof as well as the appended drawings.

To achieve these objects and other advantages and in accordance with the purpose of the specification, as embodied and broadly described herein, a mobile terminal according to the present invention comprises a case; a main board packaged in the case; a signal supply unit packaged on the main board, supplying a radio signal; an antenna radiator packaged in the case, including a conductive material and transmitting and receiving a signal of a first frequency; an antenna tuner packaged in the case, including a conductive material; a feeding line located on the main board, having one end connected with the signal supply unit and the other end connected with the antenna radiator; and a tuning line located on the main board, having one end connected to the feeding line and the other end connected with the antenna tuner, wherein the tuning line and the antenna tuner compensate for impedance of the feeding line and the antenna radiator.

A difference between a length $L_1$ of the feeding line and a length $L_2$ of the tuning line may be an odd number multiple of ¼ wavelength of the first frequency.

The difference between the length $L_1$ of the feeding line and the length $L_2$ of the tuning line satisfies $\lambda_{\mathit{eff}}(2n-1)/4$, and $\lambda_{\mathit{eff}}$ may be a wavelength length actually generated when the first frequency passes through the tuning line.

The antenna tuner may be formed to have a length corresponding to a length of the antenna radiator.

The antenna tuner may have a length different from that of the antenna radiator, the mobile terminal may further comprise a matching network located in the tuning line.

The matching network may be located at the other end of the tuning line.

The antenna radiator and the antenna tuner are bar shapes, and are arranged in parallel, and the mobile terminal may further comprise an isolator located between the antenna radiator and the antenna tuner.

The isolator may connect a position adjacent to a contact point portion between the antenna radiator and the feeding line with a position adjacent to a contact point portion between the antenna tuner and the tuning line.

The antenna radiator and the antenna tuner may be arranged vertically.

The antenna radiator may additionally transmit and receive a signal of a second frequency, and the mobile terminal may further comprise a bandpass filter located in the tuning line, passing through the first frequency signal and failing to pass through the second frequency signal.

The antenna radiator may additionally transmit and receive a signal of a second frequency, and the mobile terminal may further comprise a switch located in the tuning line, being turned ON when the antenna radiator receives the first frequency signal and being turned OFF when the antenna radiator receives the second frequency signal.

The mobile terminal may further comprise a second feeding line connecting the antenna tuner with the signal supply unit.

A third frequency signal transmitted and received through the second feeding line may be different from the first frequency signal.

The mobile terminal according to the present invention can prevent wireless communication performance from being deteriorated by impedance distorted by an external environment like that a body of a user approaches an antenna radiator.

Also, since the mobile terminal according to the present invention has a simple structure and does not consume a separate power, its implementation is easy, whereby the manufacturing cost can be reduced.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings, which are given by illustration only, and thus are not limitative of the present invention, and wherein:

FIG. 1A is a block diagram of a mobile terminal in accordance with the present disclosure.

DETAILED DESCRIPTION OF THE PREFERRED EMBODIMENTS

Figure 1B:
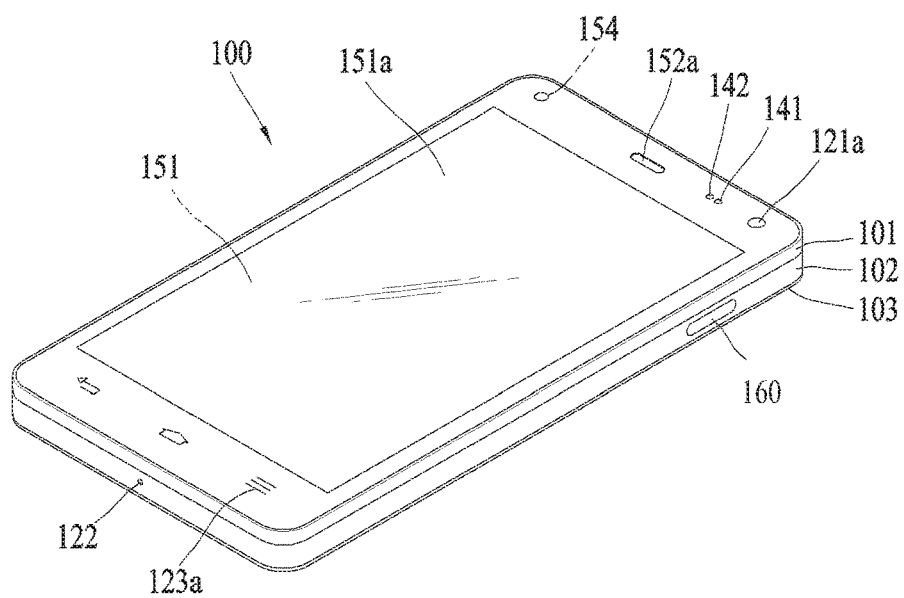
FIGS. 1B and 1C are conceptual views of one example of the mobile terminal, viewed from different directions.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context. Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

Figure 1C:
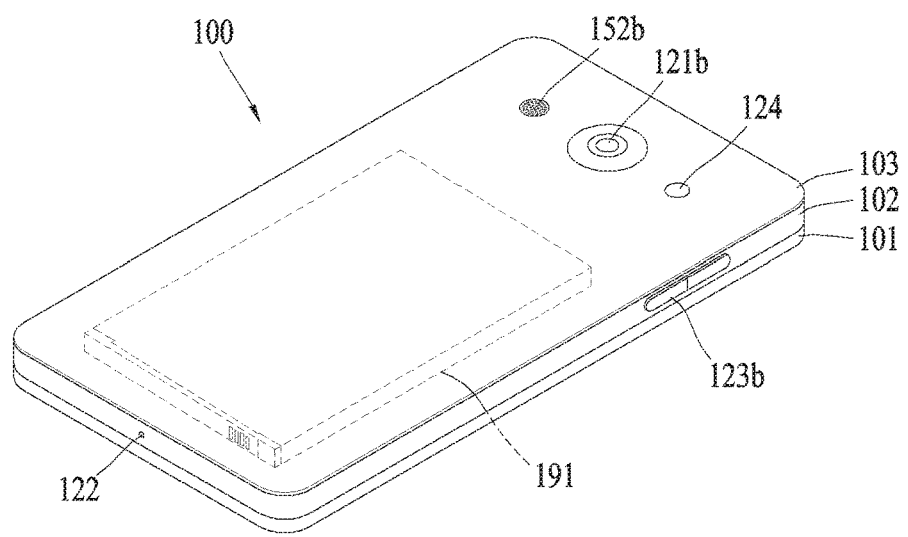

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190.

It is understood that implementing all of the illustrated components in The FIG. 1A is not a requirement, and that greater or fewer components may alternatively be implemented.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs.

The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

Some or more of the components may be operated cooperatively to embody an operation, control or a control method of the mobile terminal in accordance with embodiments of the present disclosure. Also, the operation, control or control method of the mobile terminal may be realized on the mobile terminal by driving of one or more application problems stored in the memory 170.

Referring still to FIG. 1A, various components depicted in this figure will now be described in more detail.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal.

As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 may be configured to permit various types of input to the mobile terminal 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like. The controller 180 generally cooperates with the sending unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact.

The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like).

In general, the controller 180 processes data corresponding to proximity touches and proximity touch patterns sensed by the proximity sensor 141, and cause output of visual information on the touch screen. In addition, the controller 180 can control the mobile terminal 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches include a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images. A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc.), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 can be configured to receive an external power or an internal power under the control of the controller 180 so as to supply an appropriate power required for operating the respective elements and components included in the mobile terminal 100. The power supply unit 190 may include a battery, and the battery may be configured to be embedded in the terminal body, or configured to be detachably coupled to the terminal body for charging, etc.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like).

However, such teachings with regard to a particular type of mobile terminal will generally apply to other types of mobile terminals as well.

Here, the terminal body may be understood to refer to the concept of this bore a mobile terminal (100) to at least one of the aggregate.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal includes a display unit 151, a first and a second audio output modules 151a/151b, a proximity sensor 141, an illumination sensor 142, an optical output module 154, a first and a second cameras 121a/121b, first and second manipulation units 123a/123b, a microphone 122, an interface unit 160 and the like.

It will be described for the mobile terminal as shown in FIGS. 1B and 1C. The display unit 151, the first audio output module 151a, the proximity sensor 141, an illumination sensor 142, the optical output module 154, the first camera 121a and the first manipulation unit 123a are arranged in front surface of the terminal body, the second manipulation unit 123b, the microphone 122 and the interface unit 160 are arranged in side surface of the terminal body, and the second audio output modules 151b and the second camera 121b are arranged in rear surface of the terminal body.

It is to be understood that alternative arrangements are possible and within the teachings of the instant disclosure. Some components may be omitted or rearranged. For example, the first manipulation unit 123a may be located on another surface of the terminal body, and the second audio output module 152b may be located on the side surface of the terminal body.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 1C, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Hereinafter, the embodiments related to a control method that can be implemented in the mobile terminal 100 configured as above will be described with reference to the accompanying drawings. It will be apparent to those skilled in that art that the present invention can be embodied in other specific forms within the range that does not depart from spirits and essential features of the present invention.

Figure 2:
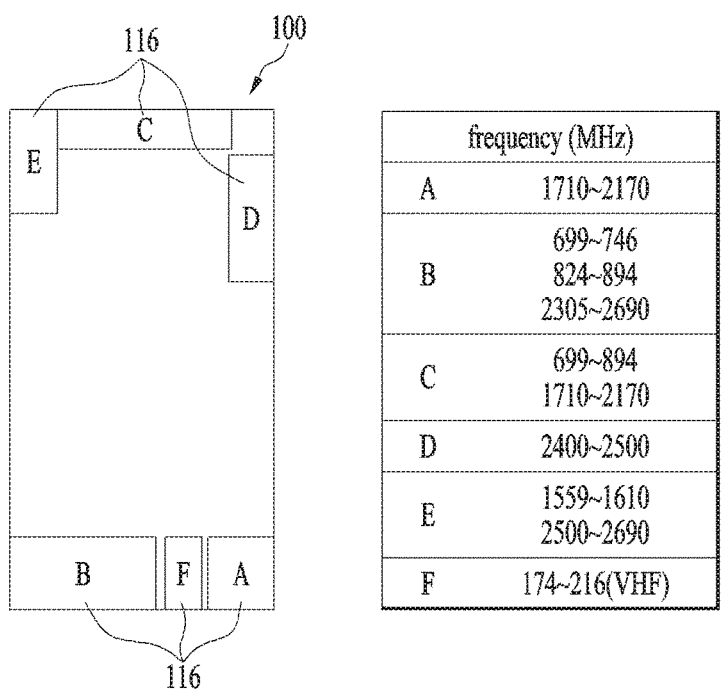
FIG. 2 is a conceptual view illustrating an example of arrangement of antenna radiators of a mobile terminal according to the present invention.

FIG. 2 is a conceptual view illustrating an example of arrangement of antenna radiators 116 of a mobile terminal 100 according to the present invention. The mobile terminal 100 may include a plurality of antenna radiators 116 to transmit and receive radio signals of various frequency bands in accordance with enlargement of multimedia functions.

The antenna radiator 116 is a conductive material for transmitting and receiving a signal of a specific frequency under the control of a wireless communication module, and may have one side connected with a signal supply unit 182 for applying a power corresponding to a predetermined signal under the control of the wireless communication module and may be attached to a surface of a case to minimize an effect from the other parts inside the mobile terminal or the case may be used as the antenna radiator 116.

In this embodiment, the mobile terminal 100 provided with six antenna radiators 116 is illustrated as an example, wherein each of the six antenna radiators 116 transmits and receives a signal at a designated frequency band. One antenna radiator 116 may transmit and receive signals of a plurality of frequency bands. The number of antenna radiators 116 may be more than or less than 6, and the antenna radiators 116 may be arranged differently from the shown arrangement.

Generally, since a length of a wavelength is short in case of a high frequency, the antenna radiator 116 has a short length. Also, since the length of the wavelength is long in case of a low frequency, the antenna radiator 116 has a long length. That is, the length of the antenna radiator 116 corresponds to a wavelength length of a signal which is transmitted and received. However, since F is a DMB antenna and uses a relatively low frequency band, the length of the wavelength is long and therefore the length of the antenna radiator 116 may be extended through an earphone. Since the antennas of a low frequency band have a long length of the antenna radiator 116 and a narrow bandwidth, there is difficulty in antenna matching.

As the number of antennas is increased, a packaging space of the antennas is arranged outwardly, and particularly, if a part of a case is comprised of a conductive material and used as the antenna radiator 116, a problem occurs in that wireless communication performance may be deteriorated by a hand of a user.

Figure 3:
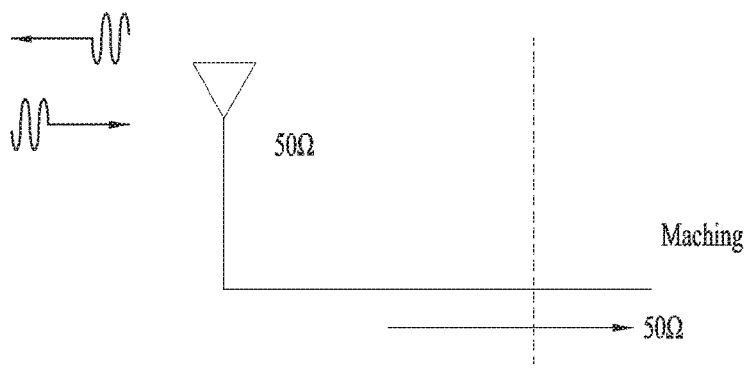
FIG. 3 is a conceptual view illustrating a problem of a wireless communication function when a user grips a mobile terminal with a hand.
Figure 3:
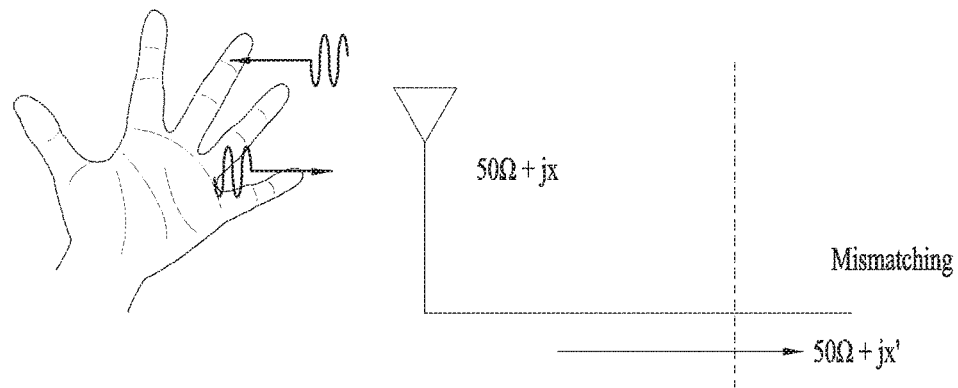
Figure 3:
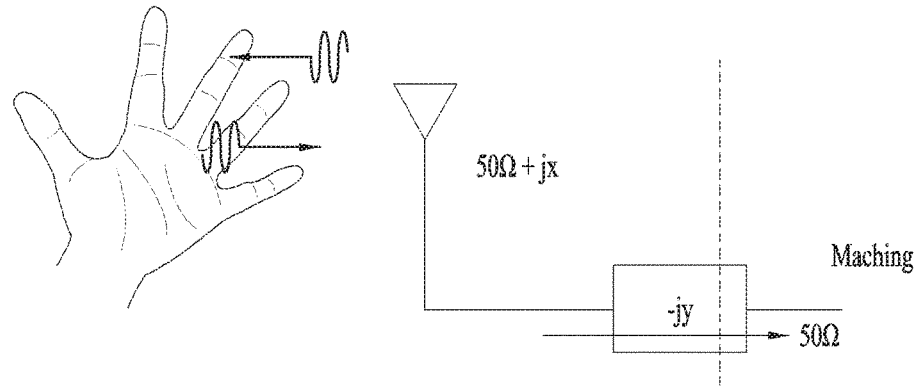

FIG. 3 is a conceptual view illustrating a problem of a wireless communication function when a user grips a mobile terminal 100 with a hand. I is a view for describing transmission and reception of a signal when a user does not grip the mobile terminal with a hand. At an ideal status, the antenna radiator 116 is operated with matched reflective loss of impedance of 50Ω.

If the hand of the user approaches the mobile terminal as shown in II, an imaginary component of impedance as much as jx, that is, a reactance value is generated, whereby impedance is distorted. Although a resistance is almost uniformly maintained at 50Ω, the reactance value is generated, whereby impedance mismatching is generated. For this reason, energy efficiency is reduced and communication quality is deteriorated.

Figure 13:
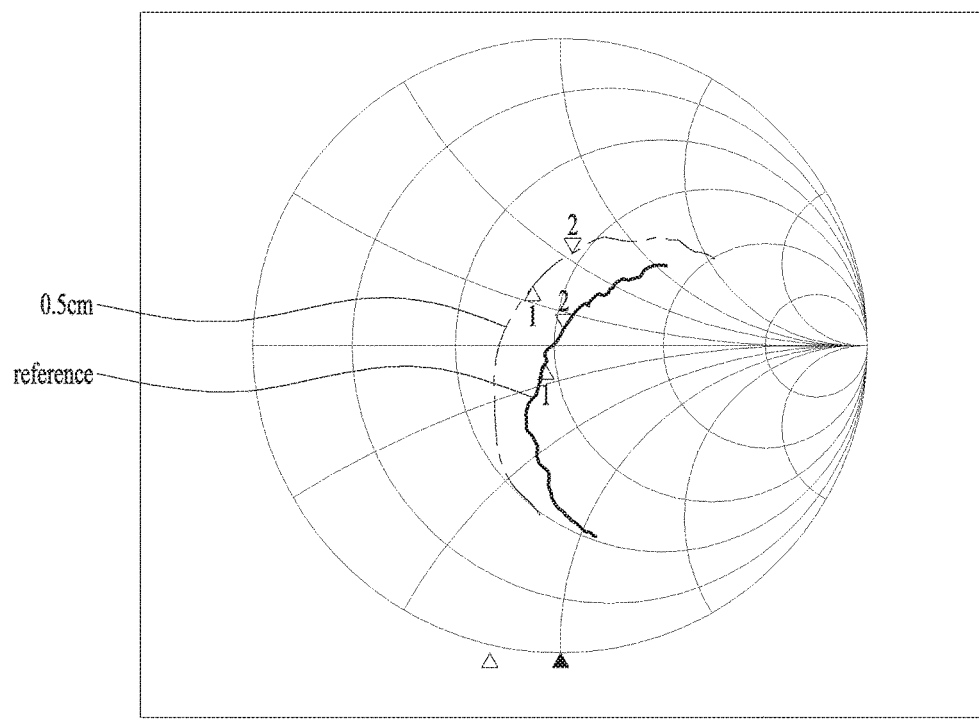
FIG. 13 is a graph illustrating impedance variance occurring when a hand of a user approaches a mobile terminal of the related art.

A circuit having a value of −jy (y≈x) which counterbalances jx generated by the hand of the user may additionally be provided as shown in III to compensate for mismatching of impedance, which is caused by the hand of the user. FIG. 13 is a graph illustrating impedance variance occurring when a hand of a user approaches a mobile terminal 100 of the related art. This graph called Smith chart is a graph illustrating an impedance value.

In FIG. 13, an impedance value varied per frequency of the antenna radiators 116 is illustrated, wherein a reference case that the user does not grip the mobile terminal with the hand and a case that a distance between the user and the antenna radiator 116 is 0.5 cm as the user grips the mobile terminal are illustrated. The closer the distance between the hand of the user and the antenna radiator 116 is, the greater the generated mismatching is.

A resonant frequency of the antenna radiator 116, that is, a signal which is transmitted and received, has a frequency in the range of 2.4 GHz to 2.5 GHz. In the graph, 1 is an impedance value at 2.4 GHz, and 2 is an impedance value at 2.5 GHz. An imaginary portion at an upper side based on the center line has a positive value and an imaginary portion at a lower side based on the center line has a negative value.

It is ideal that the value of the imaginary portion is close to 0. When the hand of the user does not touch the mobile terminal, reactance is 10.918 pF at 2.4 GHz, and is 227.44 pH at 2.5 GHz. F (farad) means that reactance has a negative value, and H (Hanley) means that reactance has a positive value. If the user grips the mobile terminal 100 with the hand, the reactance value is varied to 1.0546 nH at 2.4 GHz and varied to 1.9278 nH at 2.5 GHz, whereby the reactance value becomes great.

To counterbalance this variation, the mobile terminal 100 of the present invention further includes an antenna tuner 117. The antenna tuner 117 is made of a conductive material in the same manner as the antenna radiator 116, and is connected with a feeding line of the antenna radiator 116 through a tuning line.

Figure 4:
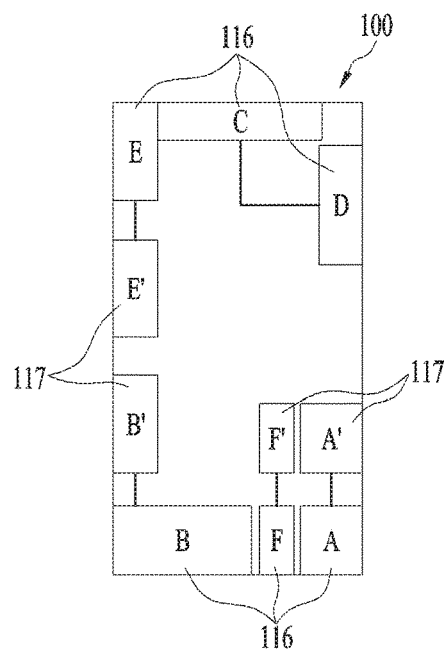
FIG. 4 is a conceptual view illustrating an example of arrangement of antenna radiators and antenna tuners of a mobile terminal according to the present invention.
Figure 14:
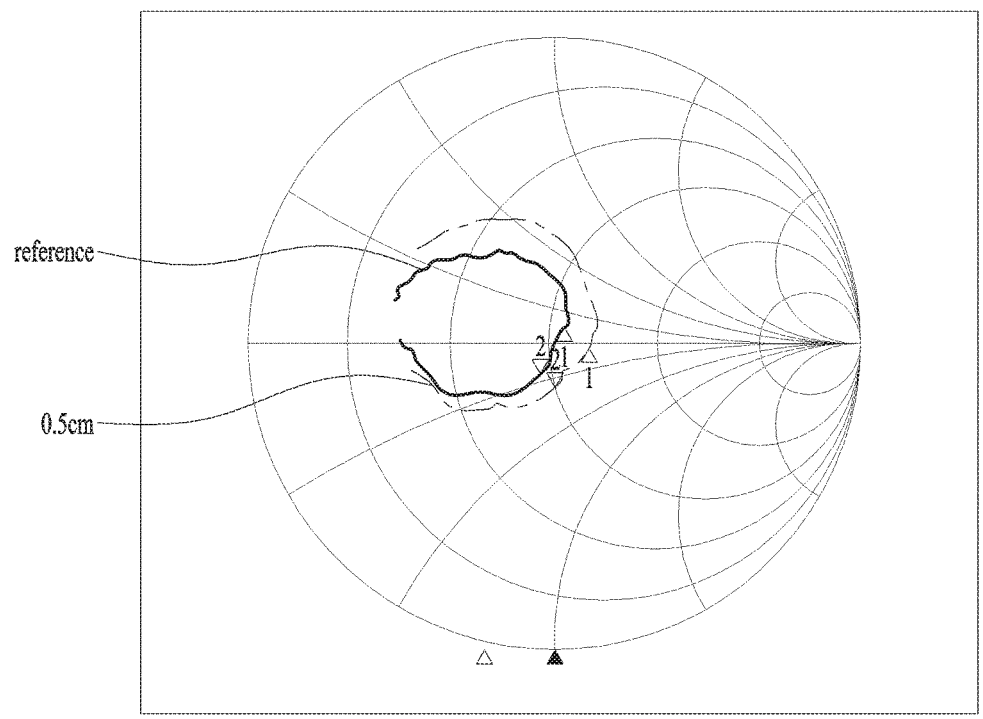
FIG. 14 is a graph illustrating performance variance occurring when a hand of a user approaches a mobile terminal provided with an antenna radiator and an antenna tuner according to the present invention.

FIG. 4 is a conceptual view illustrating an example of arrangement of antenna radiators 116 and antenna tuners 117 of a mobile terminal 100 according to the present invention. In FIG. 14, the antenna tuner 117 connected to each antenna radiator 116 may additionally be provided.

Alternatively, other antenna radiators 116 such as an antenna radiator 116 C and an antenna radiator 116 D may be used as the antenna tuner 117. Since the antenna radiator 116 C and the antenna radiator 116 D are operated at their respective frequency bands, the antenna radiator 116 D may serve as the antenna tuner 117 during operation at frequency bandwidths 699 MHz to 746 MHz of the antenna radiator 116 C.

Figure 5:
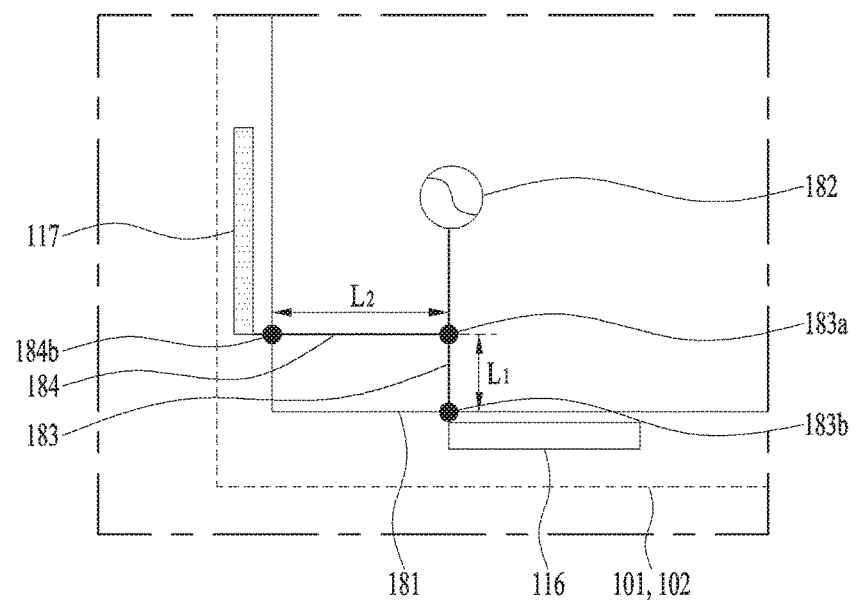
FIG. 5 is a conceptual view illustrating an example of a connection mode of antenna radiators and antenna tuners of a mobile terminal according to the present invention.

FIG. 5 is a conceptual view illustrating an example of a connection mode of antenna radiators 116 and antenna tuners 117 of a mobile terminal 100 according to the present invention. FIG. 5 illustrates a connection mode between the antenna radiator 116 located at a corner and the antenna tuner 117.

The antenna radiator 116 is supplied with a signal from the signal supply unit 182, which provides a first frequency signal, through a feeding line 183. One end of the feeding line 183 is connected to the signal supply unit 182, and the other end of the feeding line 183 is connected to the antenna radiator 116. Since the feeding line 183 is located on a main board 181 and the main board 181 includes a ground surface, a conductive line arranged to overlap the ground surface is referred to as the feeding line 183. The antenna radiator 116 connected to the other end of the feeding line 183 is arranged so as not to overlap the main board 181.

The antenna radiator 116 may not be comprised of one conductor, and various types of conductors may be connected to each another to form the antenna radiator 116. For example, an antenna pattern attached to the case and an antenna pattern formed on a flexible board may be connected to each other to configure one antenna radiator 116. A length of the antenna radiator 116 corresponds to a wavelength length of a first frequency which is transmitted and received.

The antenna tuner 117 has a length similar to that of the antenna radiator 116, and is made of a conductive material. A tuning line 184 is located on the main board 181 in the same manner as the feeding line 183, and one end of the tuning line 184 is connected to one end of the feeding line 183, and the other end of the tuning line 184 is connected to the antenna tuner 117.

As shown in FIG. 5, the feeding line 183 means a point from a point 183a (feeding portion) to which the tuning line 184 is connected to a point 183b (contact point portion) connected with the antenna radiator 116. In the drawing, it is regarded that a line portion extended from the signal supply unit 182 to the feeding portion 183a is included in the signal supply unit 182. The contact point portion is located at an end of the main board 181, and it is regarded that a line portion extended from the contact point portion 183b to an outer side of the main board 181 is included in the antenna radiator 116.

Likewise, since the tuning line 184 means a portion located on the main board 181, it is regarded that a portion extended from the feeding portion 183a to the end 184b of the main board 181 is included in the tuning line 184 and the portion extended to the outside of the main board 181 is included in the antenna tuner 117.

To compensate for impedance mismatching as described above, a reactance value varied if the hand of the user touches the mobile terminal should have a negative value.

This reactance variance is caused by the feeding line 183 located on the main board 181, and may determine a length of the tuning line 184 so that the tuning line 184 may compensate for the reactance variance. The reactance relates to a tangent value of a value obtained by dividing the length of the feeding line 183 by a wavelength, wherein the tangent value is varied at a predetermined period.

Figure 6:
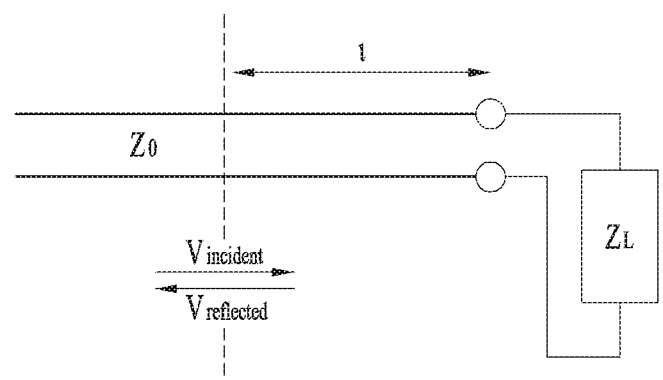
FIG. 6 is a view illustrating a variance of a reflective impedance value according to a length of a feeding line.
Figure 6:
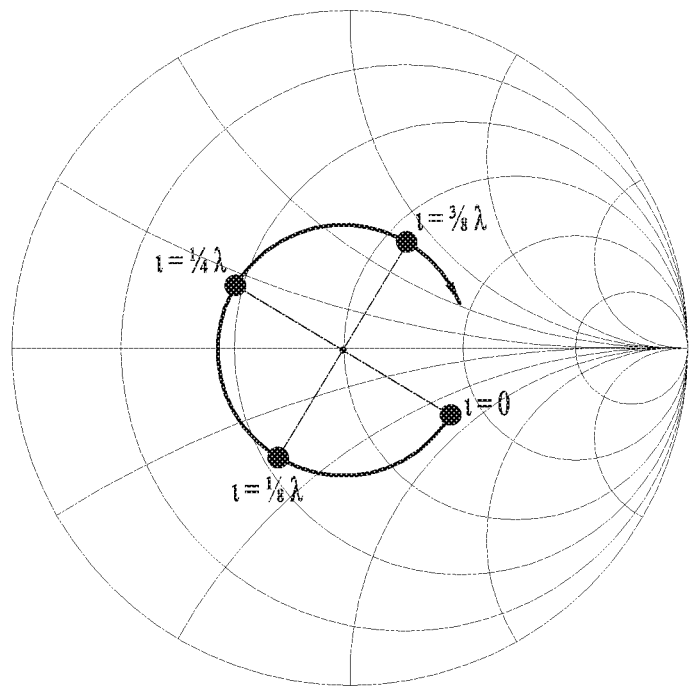
Figure 7:
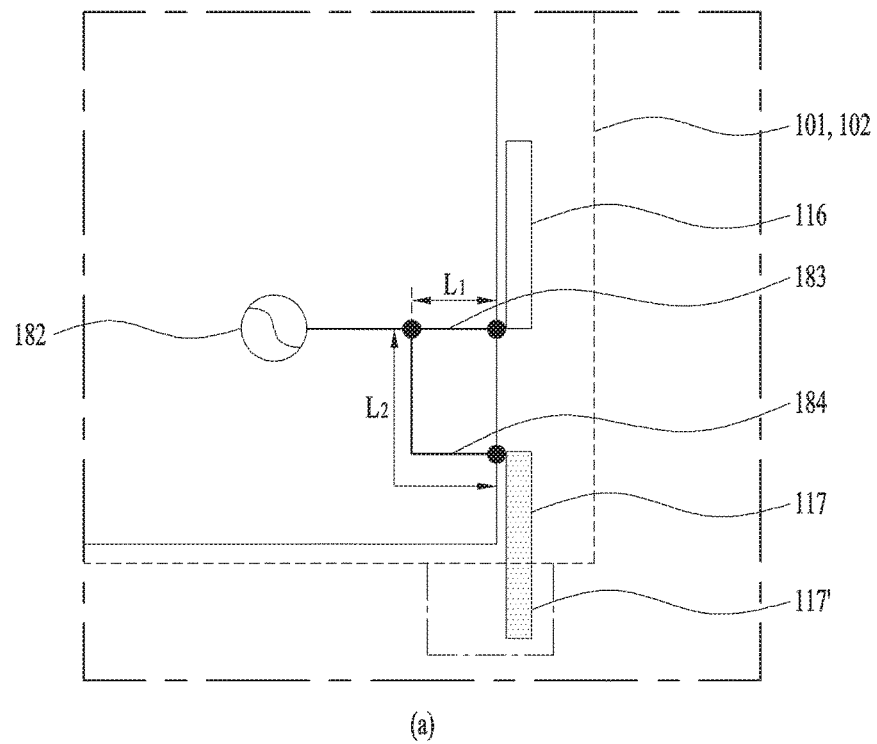
FIGS. 7 to 10 are conceptual views illustrating a problem occurring when an antenna radiator and an antenna tuner of a mobile terminal according to the present invention are arranged and an example of solving the problem.
Figure 7:
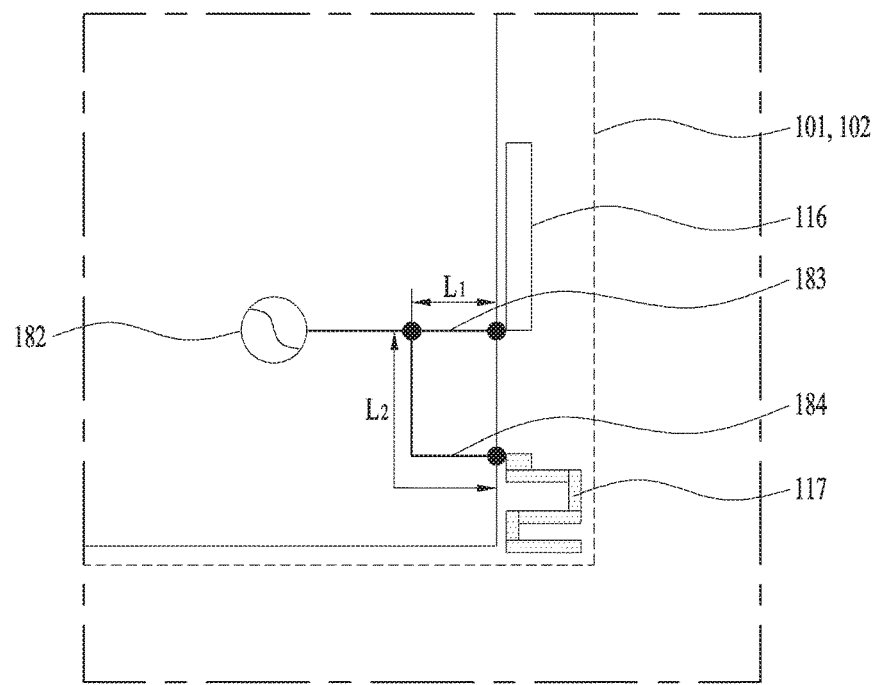

FIG. 6 is a view illustrating a variance of a reflective impedance value according to a length of a feeding line 183. As shown in FIG. 6(a), reflective impedance is determined in accordance with a distance 1 from the feeding portion to the antenna radiator 116 or the antenna tuner 117, that is, a length of the feeding line 183 and the tuning line 184.

FIG. 6(b) is a graph illustrating variance of reflective impedance. Referring to FIG. 6(b), if a length of the feeding line 183 or the tuning line 184 becomes long as much as λ/4, a reverse reactance value is obtained. Therefore, if there is a difference between the length of the feeding line 183 and the length of the tuning line 184 as much as λ/4, the reactance value is compensated.

Figure 8:
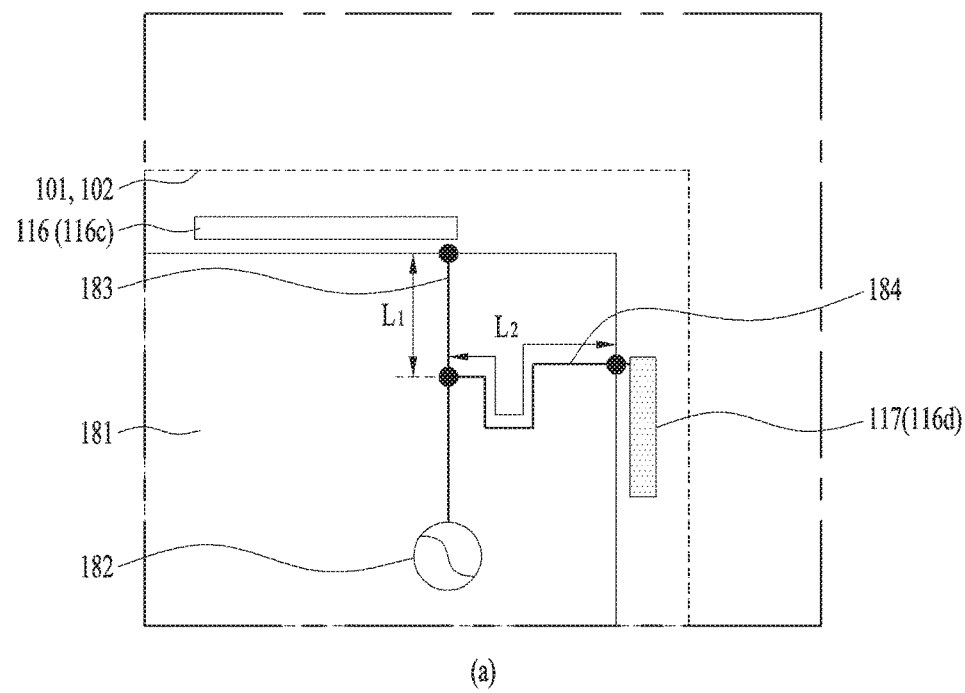
Figure 8:
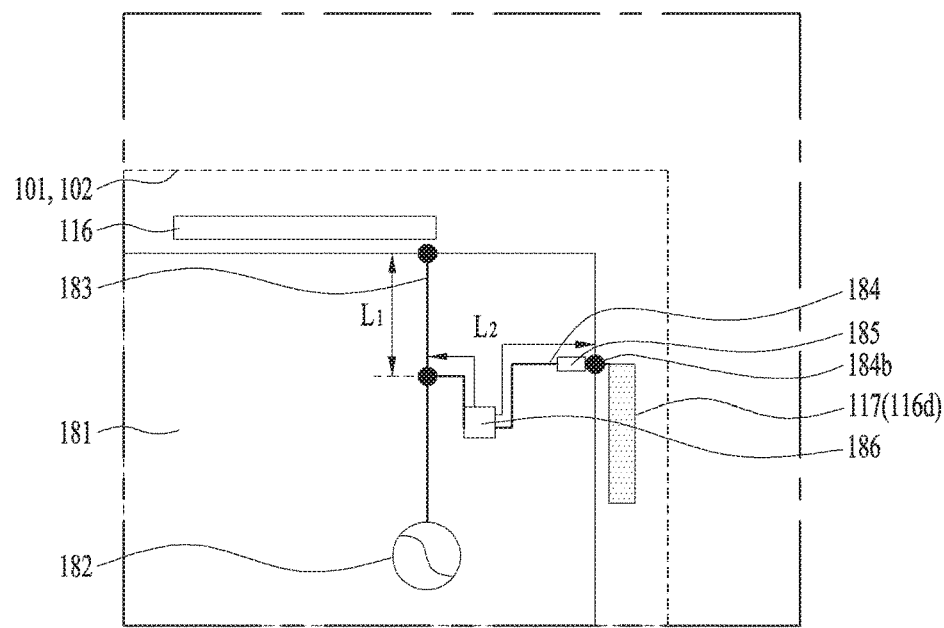

If the length difference between the feeding line 183 and the tuning line 184 satisfies λ(2n−1)/4, a reverse reactance value is obtained through one cycle on the graph. The tuning line 184 may be shorter than the feeding line 183. At this time, since the wavelength λ is affected by a peripheral environment (dielectric constant of the main board 181, etc.) through which a signal passes, a wavelength length is varied. Therefore, more exactly, the length of the tuning line 184 satisfies λeff(2n−1)/4 based on a wavelength λeff which has compensated for variance of the peripheral environment. The tuning line 184 may be arranged in a folding type as shown in FIG. 8 to satisfy the above length formula.

FIGS. 7 to 10 are conceptual views illustrating a problem occurring when an antenna radiator 116 and an antenna tuner 117 of a mobile terminal 100 according to the present invention are arranged and an example of solving the problem.

If a space for packaging the antenna tuner 117 is not sufficient in accordance with restriction of the space of the mobile terminal 100 as shown in FIG. 7(a), a method for solving this is disclosed. The antenna tuner 117 is not required to be certainly a straight line or may not have the same shape as that of the antenna radiator 116. Since the antenna tuner 117 only has to have a length corresponding to the antenna radiator 116, the antenna tuner 117 may be formed in a folded pattern as shown in FIG. 7(b).

Since the shape of the antenna tuner 117 cannot be modified to the shape shown in FIG. 7(b), a case that the antenna tuner 117 should be formed at a short length as shown in FIG. 8(a) may occur. In FIG. 4, if the antenna radiators 116 adjacent to each other are used as the antenna tuner 117, since the length of the antenna tuner 117 is fixed, a matching circuit 185 for compensating for an insufficient length of the antenna tuner 117 may further be provided as shown in FIG. 8(b). The matching circuit 185 may be arranged at a position closest to the antenna tuner 117, that is, the contact point portion 184b of the tuner to minimize an error.

The matching circuit 185 may include an inductor and a capacitor, and controls impedance values of these two devices to compensate for the length of the antenna tuner 117, so that the length of the antenna tuner 117 has impedance of a length corresponding to the length of the antenna radiator 116.

The antenna radiator 116 may transmit and receive a first frequency signal and a second frequency signal. Since the antenna tuner 117 and the tuning line 184 are designed to compensate for impedance at the first frequency signal, they may fail to serve as the antenna tuner 117 at the second frequency signal.

In this case, when the second frequency signal is transmitted and received, a power may flow to the antenna tuner 117, whereby power consumption may be caused. To avoid power consumption, a filter 186 may be interposed in the tuning line 184.

That is, a bandpass filter, which passes through the first frequency signal and does not pass through the second frequency signal, may be used as the filter 186, or a switch which is turned ON when the first frequency signal is received and turned OFF when the second frequency signal is received may be used as the filter 186.

The bandpass filter and the switch are connected with the antenna tuner 117 through the first frequency signal only and disconnected with the antenna tuner 117 through the second frequency signal.

Figure 9:
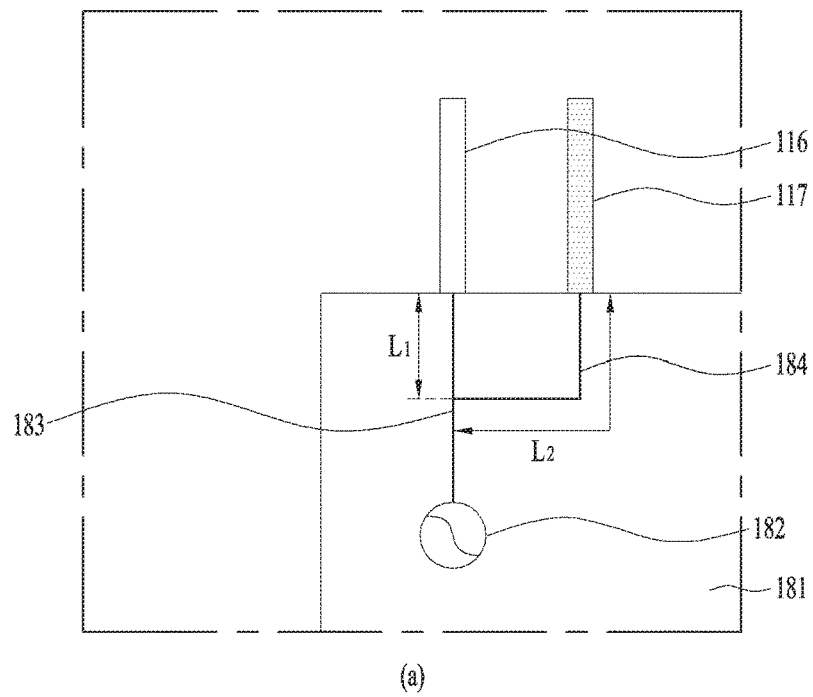
Figure 9:
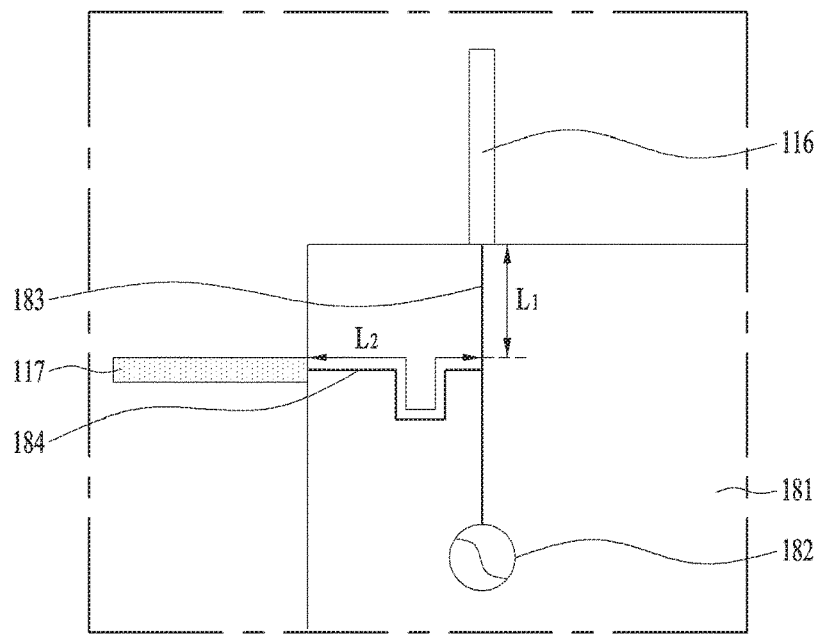
Figure 10:
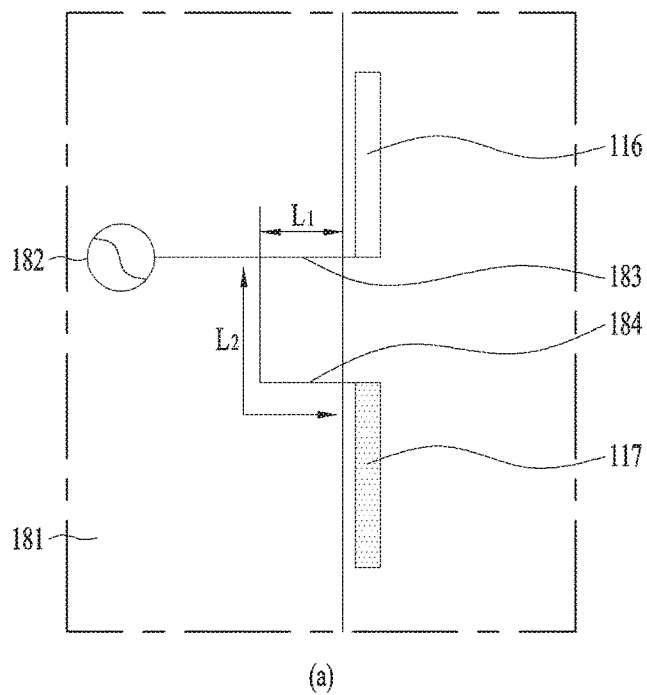
Figure 10:
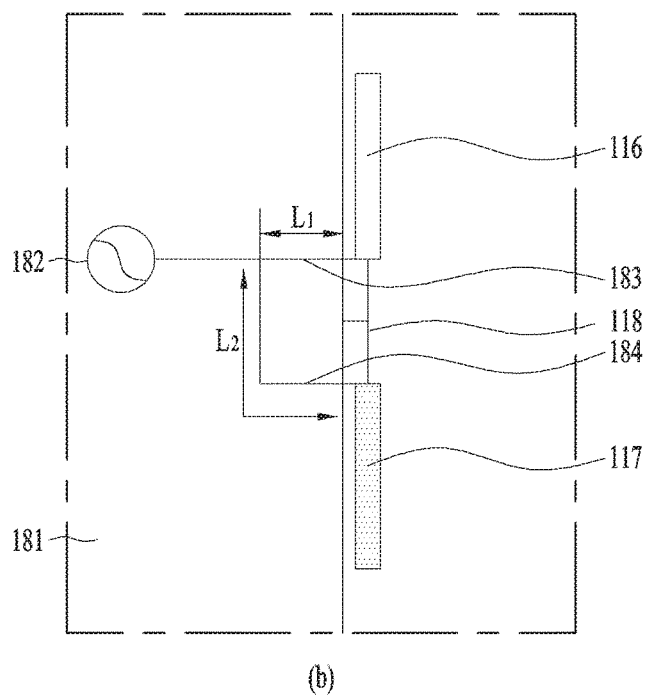

Next, FIGS. 9 and 10 suggest a method for solving a problem occurring when the antenna radiator 116 and the antenna tuner 117 are arranged in parallel with each other. If the antenna radiator 116 and the antenna tuner 117 are arranged in parallel with each other, they correspond to co-polarization, whereby the antenna radiator 116 is affected by interference of the antenna tuner 117.

To solve the above problem, if the antenna radiator 116 and the antenna tuner 117 are arranged vertically as shown in FIG. 9(b), they correspond to cross-polarization, whereby they are not affected by each other and thus interference is cancelled.

Alternatively, an isolator is connected to the antenna and the antenna tuner 117 as shown in FIG. 10(b). The isolator is a conductive material connecting the antenna tuner 117 with the antenna radiator 116, and may reduce mutual interference between the antenna radiator 116 and the antenna tuner 117 and may be operated independently by connecting the contact point portion 183b of the antenna radiator 116 with the contact point portion 184b of the antenna tuner 117 or connecting positions adjacent to the contact point portions with each other.

Figure 11:
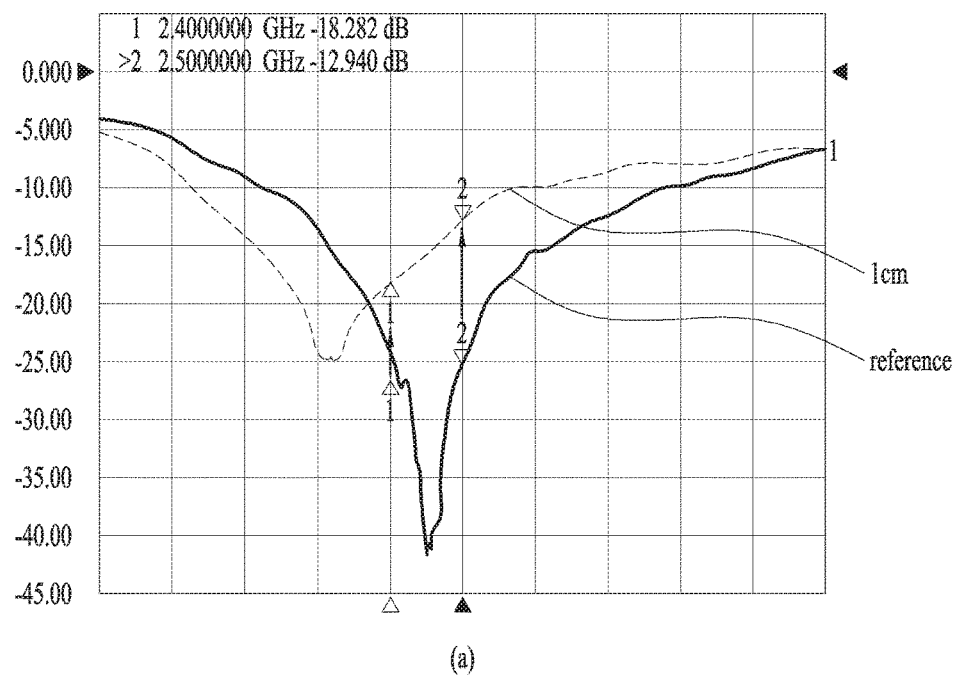
FIG. 11 is a graph illustrating performance variance occurring when a hand of a user approaches a mobile terminal of the related art.
Figure 11:
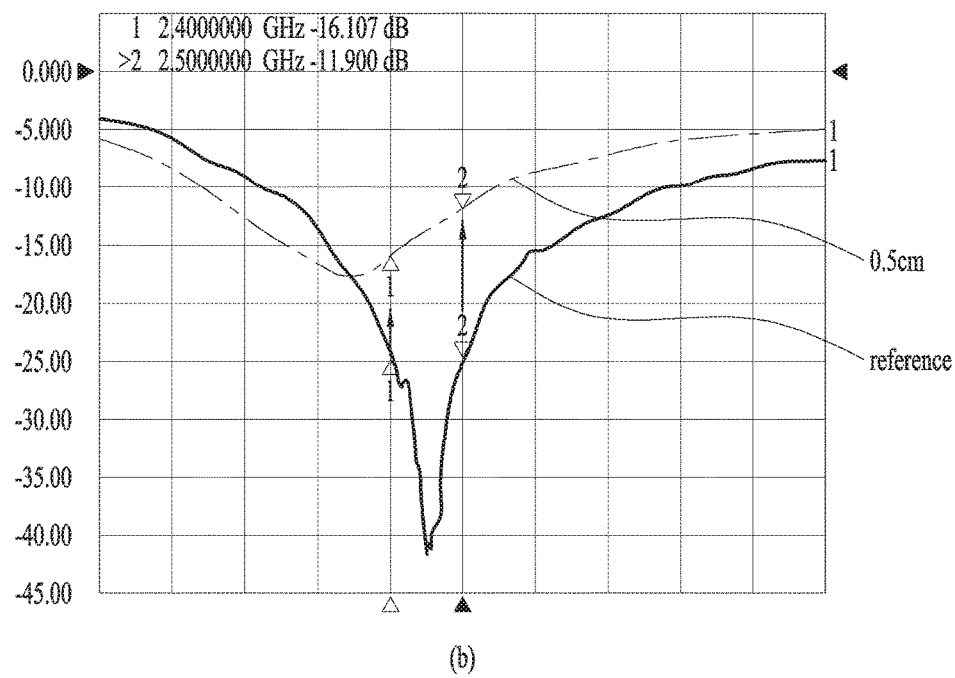

FIG. 11 is a graph illustrating performance variance occurring when a hand of a user approaches a mobile terminal 100 of the related art. The graph shown in FIG. 11 is S11 graph, wherein a horizontal axis represents a frequency. The graph shown in FIG. 11 indicates that the smaller the frequency is, the more excellent performance of the corresponding frequency is. FIG. 11(a) illustrates variance of performance in a reference case that the hand of the user does not approach the mobile terminal and a case that the hand of the user approaches the antenna radiator 116 in the range of 1 cm, and FIG. 11(b) illustrates variance of performance in a reference case that the hand of the user does not approach the mobile terminal and a case that the hand of the user approaches the antenna radiator 116 in the range of 0.5 cm.

This antenna radiator 116 is the antenna radiator 116 that transmits and receives signals of 2.4 GHz and 2.5 GHz. If the hand of the user approaches the antenna radiator 116 as much as 1 cm, attenuation occurs at a level of 3 dB to 12 dB, and if the hand of the user approaches the antenna radiator 116 as much as 0.5 cm, attenuation occurs at a level of 5 dB to 13 dB.

Figure 12:
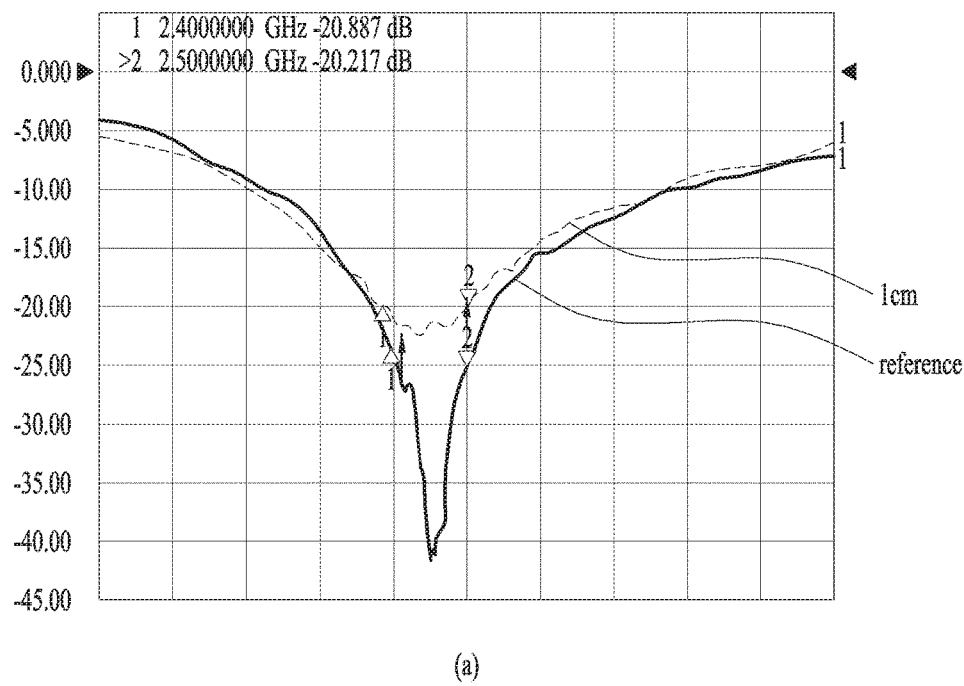
FIG. 12 is a graph illustrating performance variance occurring when a hand of a user approaches a mobile terminal provided with an antenna radiator and an antenna tuner according to the present invention.
Figure 12:
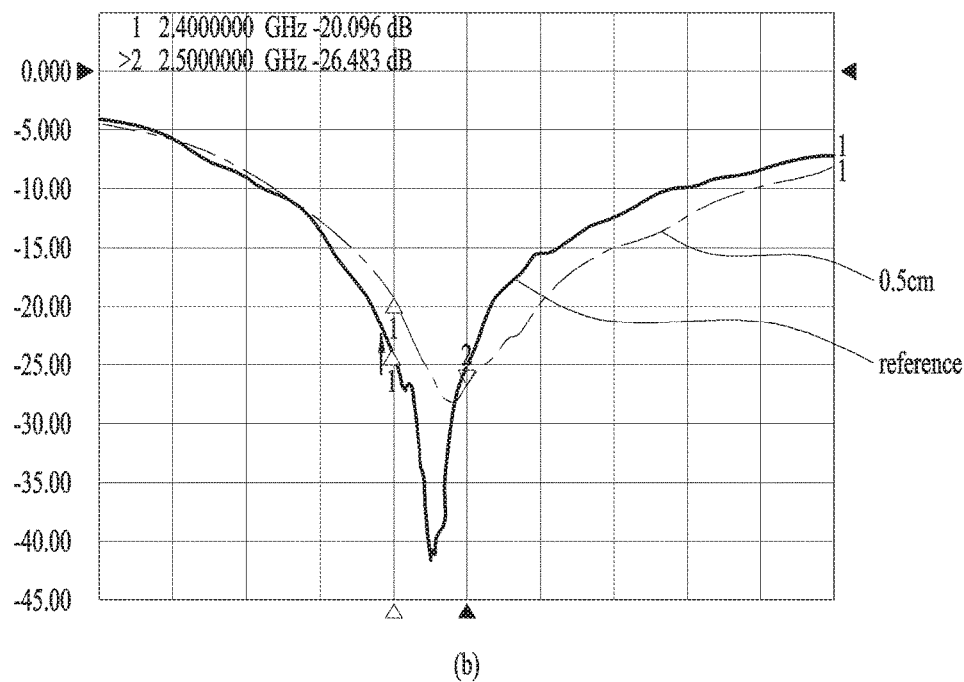

FIG. 12 is a graph illustrating performance variance occurring when a hand of a user approaches a mobile terminal 100 provided with an antenna radiator 116 and an antenna tuner 117 according to the present invention. FIG. 12(a) illustrates variance of performance in a reference case that the hand of the user does not approach the mobile terminal and a case that the hand of the user approaches the antenna radiator 116 in the range of 1 cm, and FIG. 12(b) illustrates variance of performance in a reference case that the hand of the user does not approach the mobile terminal and a case that the hand of the user approaches the antenna radiator 116 in the range of 0.5 cm.

If the antenna tuner 117 is provided, attenuation occurs at a level of 1 dB to 6 dB when the hand of the user approaches the antenna radiator 116 as much as 1 cm, and attenuation occurs at a level of 1 dB when the hand of the user approaches the antenna radiator 116 as much as 0.5 cm. It is noted that performance is hardly deteriorated even though the hand (body) of the user approaches the antenna radiator 116 when the antenna tuner 117 is provided.

FIG. 13 is a graph illustrating impedance variance occurring when a hand of a user approaches a mobile terminal 100 of the related art, and FIG. 14 is a graph illustrating performance variance occurring when a hand of a user approaches a mobile terminal 100 provided with an antenna radiator 116 and an antenna tuner 117 according to the present invention.

FIGS. 13 and 14 are graphs called Smith Chart, and illustrate impedance variance. Resistance values have the same values along a circle, and a reactance value at an upper portion based on a center line of a horizontal direction has a positive value and a reactance value at a lower portion based on the center line of the horizontal direction has a negative value. Since signal distortion is little generated if a reactance component is close to 0, it is noted that the reactance component becomes great when the body of the user is close to the antenna radiator 116 as much as 0.5 cm if the antenna radiator 116 is only provided as described above.

Those in the upper lines among numbers below the drawing indicate impedance of a reference case that the user does not grip the mobile terminal with the hand, and those in the lower lines among the numbers below the drawing indicate impedance of a case that the distance between the user and the antenna radiator 116 is 0.5 cm as the user grips the mobile terminal.

To compensate for the impedance, the antenna radiator 116 and the turning line 184, which satisfies the aforementioned condition, are provided in present invention, whereby impedance variation can be obtained as shown in FIG. 14. If the antenna tuner 117 and the tuning line 184 are provided, since reactance still has a value close to 0 even though the body of the user approaches the mobile terminal, the wireless communication function can be used stably without signal distortion.

As described above, the mobile terminal 100 according to the present invention can prevent wireless communication performance from being deteriorated by impedance distorted by an external environment like that the body of the user approaches the antenna radiator 116.

Also, since the mobile terminal according to the present invention has a simple structure and does not consume a separate power, its implementation is easy, whereby the manufacturing cost can be reduced.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the specification are included in the scope of the invention.

What is claimed is:
1. A mobile terminal comprising:
a case;
a main board located in the case;
a signal supply unit coupled to the main board and being configured to supply a radio signal;
an antenna radiator located in the case, wherein the antenna radiator includes conductive material and is configured to transmit and receive a signal of a first frequency;

an antenna tuner located in the case, wherein the antenna tuner includes conductive material and has a length corresponding to a length of the antenna radiator;

a feeding line coupled to the main board, wherein the feeding line includes one end coupled to the signal supply unit and another end coupled to the antenna radiator; and a tuning line coupled to the main board, wherein the tuning line includes one end coupled to the feeding line and another end coupled to the antenna tuner, wherein the tuning line and the antenna tuner compensate for impedance of the feeding line and the antenna radiator, and wherein a difference between a length L1 of the feeding line and a length L2 of the tuning line is an odd number multiple of ¼ wavelength of the first frequency.

2. The mobile terminal according to claim 1, wherein the difference between the length L1 of the feeding line and the length L2 of the tuning line satisfies $\lambda\text{eff}(2n-1)/4$, where $\lambda\text{eff}$ is a wavelength length actually generated when the first frequency passes through the tuning line.

3. The mobile terminal according to claim 1, wherein the length of the antenna tuner is different from the length of the antenna radiator, and wherein the mobile terminal further comprises a matching network located in the tuning line.

4. The mobile terminal according to claim 3, wherein the matching network is located at the another end of the tuning line.

5. The mobile terminal according to claim 1, wherein the antenna radiator and the antenna tuner are bar shaped and are arranged in parallel, wherein the mobile terminal further comprises an isolator located between the antenna radiator and the antenna tuner.

6. The mobile terminal according to claim 5, wherein the isolator connects a position adjacent to a contact point portion between the antenna radiator and the feeding line with another position adjacent to a contact point portion between the antenna tuner and the tuning line.

7. The mobile terminal according to claim 1, wherein the antenna radiator and the antenna tuner are arranged vertically.

8. The mobile terminal according to claim 1, wherein the antenna radiator is further configured to transmit and receive a signal of a second frequency, wherein the mobile terminal further comprises a bandpass filter located in the tuning line and being configured to pass the first frequency signal and block the second frequency signal.

9. The mobile terminal according to claim 1, wherein the antenna radiator is further configured to transmit and receive a signal of a second frequency, wherein the mobile terminal further comprises a switch located in the tuning line, wherein the switch is configured to turn ON when the antenna radiator receives the first frequency signal and turn OFF when the antenna radiator receives the second frequency signal.

10. The mobile terminal according to claim 1, further comprising a second feeding line connecting the antenna tuner to the signal supply unit.

11. The mobile terminal according to claim 10, wherein a third frequency signal transmitted and received through the second feeding line is different from the first frequency signal.

12. A mobile terminal comprising:

a case;

a main board located in the case;

a signal supply unit coupled to the main board and being configured to supply a radio signal;

an antenna radiator located in the case, wherein the antenna radiator includes conductive material and is configured to transmit and receive a signal of a first frequency;

an antenna tuner located in the case, wherein the antenna tuner includes conductive material and has a length different from a length of the antenna radiator;

a first feeding line coupled to the main board, wherein the first feeding line includes one end coupled to the signal supply unit and another end coupled to the antenna radiator;

a tuning line coupled to the main board, wherein the tuning line includes one end coupled to the first feeding line and another end coupled to the antenna tuner; and a matching network located in the tuning line for compensating an impedance of the antenna tuner corresponding to an impedance of the antenna radiator with the length difference, wherein the tuning line and the antenna tuner compensate for impedance of the first feeding line and the antenna radiator.

13. The mobile terminal according to claim 12, wherein the matching network is located at the another end of the tuning line.

14. The mobile terminal according to claim 12, further comprising a second feeding line connecting the antenna tuner to the signal supply unit, wherein a second frequency signal transmitted and received through the second feeding line is different from the first frequency signal.

* * * * *